(12) United States Patent
Johnson et al.

(10) Patent No.: US 12,408,503 B2
(45) Date of Patent: Sep. 2, 2025

(54) LAYERED STRUCTURE WITH DEFORMATION CONTROL LAYER

(71) Applicant: IQE plc, Cardiff (GB)

(72) Inventors: Andrew Johnson, Cardiff (GB); Andrew Joel, Cardiff (GB)

(73) Assignee: IQE plc, Cardiff (GB)

( * ) Notice: Subject to any disclaimer, the term of this patent is extended or adjusted under 35 U.S.C. 154(b) by 0 days.

(21) Appl. No.: 17/978,519

(22) Filed: Nov. 1, 2022

(65) Prior Publication Data

US 2023/0132522 A1 May 4, 2023

(30) Foreign Application Priority Data

Nov. 2, 2021 (GB) .................................... 2115721

(51) Int. Cl.
| | |
|---|---|
| *H10H 20/80* | (2025.01) |
| *H01S 5/06* | (2006.01) |
| *H01S 5/183* | (2006.01) |
| *H01S 5/20* | (2006.01) |
| *H10H 20/815* | (2025.01) |

(52) U.S. Cl.
CPC ......... *H10H 20/862* (2025.01); *H01S 5/0607* (2013.01); *H01S 5/18366* (2013.01); *H01S 5/2027* (2013.01); *H10H 20/815* (2025.01)

(58) Field of Classification Search
CPC . H01L 33/465; H01L 33/12; H01L 21/02461; H01L 21/02463; H01L 21/02466; H01L 21/02496; H01L 21/0251; H01L 21/02381; H01L 21/02436; H01L 31/0352; H01S 5/0607; H01S 5/18366; H01S 5/2027; H01S 5/20

USPC .......................................................... 257/98
See application file for complete search history.

(56) References Cited

U.S. PATENT DOCUMENTS

| | | | |
|---|---|---|---|
| 5,075,744 A | 12/1991 | Tsui | |
| 5,751,757 A * | 5/1998 | Jiang | ................... H01S 5/18386 |
| | | | 372/50.1 |

(Continued)

FOREIGN PATENT DOCUMENTS

| | | |
|---|---|---|
| CN | 113300219 A | 8/2021 |
| EP | 3422496 A | 1/2019 |
| EP | 3422496 A1 * | 1/2019 ........... H01S 5/0201 |

OTHER PUBLICATIONS

Combined Search and Examination Report in Great Britain Application No. 2115721.9, United Kingdom Intellectual Property Office, South Wales, mailed Apr. 5, 2022, 8 pages.

(Continued)

*Primary Examiner* — Brian Turner
*Assistant Examiner* — Pratiksha Jayant Lohakare
(74) *Attorney, Agent, or Firm* — Sterne, Kessler, Goldstein & Fox P.L.L.C.

(57) ABSTRACT

A layered structure comprising a substrate having a first deformation. Also one or more device layers forming a device and having a second deformation. A deformation control layer which is pseudomorphic with respect to the substrate and having a third deformation. The deformation control layer is selected such that a sum of the first, second and third deformations matches a target level of deformation. Advantageously the layered structure has a controlled, known deformation which can be compressive, tensile or zero.

20 Claims, 4 Drawing Sheets

(56) References Cited

U.S. PATENT DOCUMENTS

| | | | |
|---|---|---|---|
| 2003/0034491 A1* | 2/2003 | Lempkowski | H01L 27/0688 257/190 |
| 2007/0215905 A1 | 9/2007 | Kohiro et al. | |
| 2009/0038679 A1 | 2/2009 | Varghese et al. | |
| 2010/0158064 A1* | 6/2010 | Takahashi | H01L 33/32 257/14 |
| 2011/0026555 A1* | 2/2011 | Takeuchi | B82Y 20/00 372/45.011 |
| 2013/0065342 A1* | 3/2013 | Stauss | H01L 21/02507 438/46 |
| 2014/0353586 A1 | 12/2014 | Kyono et al. | |
| 2015/0357419 A1 | 12/2015 | Lutgen et al. | |
| 2017/0162522 A1 | 6/2017 | Chang et al. | |
| 2021/0257809 A1 | 8/2021 | Clark et al. | |

OTHER PUBLICATIONS

Extended European Search Report in European Application No. 22203749.1, European Patent Office, Munich, mailed Mar. 6, 2023, 9 pages.

Examination Report in Great Britain Application No. 2115721.9, mailed Apr. 3, 2024, 4 pages.

\* cited by examiner

LAYERED STRUCTURE WITH DEFORMATION CONTROL LAYER

CROSS REFERENCE TO RELATED APPLICATION

This application claims priority to GB Application No. 2115721.9, filed Nov. 2, 2021, which is hereby incorporated herein in its entirety by reference.

BACKGROUND

A layered structure, particularly but not exclusively for a photoemitter or photodetector device.

A layered semiconductor structure is typically formed of multiple layers which are epitaxially grown in a stack. Each layer may be a different material or composition to the previous layer which introduces a small lattice mismatch and thus strain. This strain accumulates or adds over the layer stack and can cause bow and/or warp of the structure. Such bow and/or warp may present a non-uniform surface for subsequent layer growth; may cause subsequent layers to grow with varying thickness; may cause uneven properties in subsequent layers as material deposition and heat transfer are uneven; and may add complexity and cost to device fabrication processes.

The present invention seeks to address some or all of these disadvantages.

SUMMARY

The present invention provides a layered structure comprising: a substrate having a first deformation; one or more device layers forming a device and having a second deformation; a deformation control layer which is pseudomorphic with respect to the substrate, the deformation control layer having a third deformation; wherein the deformation control layer is selected such that a sum of the first, second and third deformations matches a target level of deformation.

The deformation control layer being selected to balance the deformations in order to match a target level of deformation is advantageous because bow or warp in the substrate can be counteracted and/or a desired level of deformation can be introduced into the layered structure. It may be desirable for a layered structure to have a small, controlled, level of convex or concave deformation in order to accommodate differences in deformation between growth temperatures and operational temperatures, or to optimize device fabrication processes. For example manufacturing yields and/or reliability can be improved.

The deformation control layer may act to correct wafer bow and/or warp of the substrate at growth temperatures. Advantageously the layers grown thereon are more uniform. The deformation control layer and/or the layer stack may deform as it cools to room temperature and/or operational temperature. Advantageously the change in deformation is predictable and can therefore be designed into the layer structure.

The deformation control layer may be positioned between the substrate and the one or more device layers. Advantageously the deformation control layer may counteract or compensate for some or all of the deformation manifested by bow and/or warp of the substrate before growing or depositing additional layers. Additionally or alternatively the deformation control layer may counteract or compensate for deformation which accumulates through the thickness of the layer structure. Additionally or alternatively the deformation control layer may apply deformation which is counteracted or compensated by subsequent layers as the layer structure is grown or built.

The substrate may comprise germanium (Ge), silicon-germanium (SiGe) or silicon-germanium-tin (SeGiSn). The substrate may comprise germanium on silicon (Si), silicon germanium on silicon or silicon-germanium-tin on silicon. The first deformation may be measured at the top surface of the substrate, being that surface upon which the other layers are grown. Advantageously substrates based on Ge are mechanically stronger than previously used gallium-arsenide (GaAs) substrates and can therefore be thinner, which is cheaper since more wafers can be formed per ingot of bulk crystal. Advantageously Ge-based substrates also have a lattice constant closer to that of subsequent layers when implemented as a VCSEL.

The deformation control layer may comprise any of the group comprising indium-gallium-phosphine (InGaP), aluminum-indium-phosphide (AlInP), indium-gallium-arsenide (InGaAs), gallium-arsenide-antimonide (GaAsSb), gallium arsenide (GaAs), aluminum-gallium arsenide (AlGaAs), aluminum gallium arsenide antimonide (AlGaAsSb). Advantageously the third deformation can be engineered to be greater than or less than the sum of the first, substrate, deformation and the second, device layers, deformation so that the target level of deformation is obtained. Advantageously the third deformation can be varied by changing the composition of a selected material such that the process inputs can be the same for the growth of different layered structures having different deformations and just the proportions be changed for each growth.

The deformation control layer may comprise a single layer. Advantageously the deformation control layer may not significantly increase the total layered structure height. In conjunction with the thinner substrate enabled by the deformation control layer, the height of the layered structure may be reduced with respect to prior art layer stacks.

The deformation control layer may comprise a plurality of layers. The third deformation may be the sum of the individual deformations for each of the plurality of layers. Advantageously, each layer may introduce a small deformation but the summed deformations of the set of layers may be larger than is achievable with a single layer. There may be two or more adjacent layers having different compositions. Advantageously the resultant third deformation can equal the preferred value with minimal layer height.

Alternatively the plurality of layers may be grown or positioned at discrete positions within the layered structure. Thus one or more other layers may lie between any two deformation control layers. Advantageously each of the deformation control layers may be tailored to compensate for deformation arising in the layers below or above it, or to apply additional deformation. One or more deformation control layers may be positioned between device layers. In a VCSEL or resonant cavity light-emitting diode (RC LED), one or more deformation control layers may be positioned between the lower mirror pairs and the active layer and/or between the active layer and the upper mirror or mirror pairs. Alternatively the one or more deformation control layers may be positioned within a mirror stack, between mirror pairs. Advantageously the design parameter window may be increased so that, for example, the wavelength may be varied.

The or each deformation control layer may comprise a graded composition. It may have a first composition at its lower surface, proximal to the substrate, and a second composition at its upper surface, distal to the surface. The gradation may be linear, quadratic, governed by a higher order polynomial function, logarithmic, or be governed by any other function. Alternatively the gradation may be stepped or otherwise represent a non-smooth transition from the first to the second composition. Advantageously a graded composition reduces the possibility of an abrupt strained interface between layers which could act as a nucleation point for relaxation and thus the creation of dislocations.

The target level of deformation may be non-zero. Advantageously the deformation control layer can be used to introduce a defined level of deformation to meet requirements such as customer requirements. The target level of deformation may be a range. Advantageously the range may represent process tolerance limits.

The lattice parameter of the deformation control layer may be larger than the lattice parameter of the substrate resulting in net compressive strain and therefore convex deformation. Advantageously this can be used to compensate or counteract tensile strain elsewhere in the layer structure.

Alternatively the lattice parameter of the deformation control layer may be smaller than the lattice parameter of the substrate resulting in net tensile strain and therefore concave deformation. Advantageously this can be used to compensate or counteract compressive strain elsewhere in the layer structure.

The device layers may comprise a plurality of sublayers with opposite-acting deformations which sum to the second deformation. Thus the second deformation is the resultant deformation from the plurality of sublayers. The device layers may form a VCSEL or RC LED. The plurality of sublayers may comprise the mirror pairs and active layer. In the mirror pairs one of the pair exhibits compressive deformation whilst the other exhibits tensile deformation. The total deformation of the mirror stack is the sum of the deformations of the sublayers.

There may be one or more additional layers between the described layers of the layer stack. For example there may be one or more layers between the substrate and the deformation control layer; one or more layers between the deformation control layer and one or more device layers; or one or more layers between the substrate and the one or more device layers. There may be additional layers above (distal from the substrate) the described layers, such as a contact layer, layers forming a second device, protection layer, and/or buffer layer.

The present invention also provides a photoemitter comprising the layered structure as described; a photodetector comprising the layered structure as described; or a combined photoemitter and photodetector comprising the layered structure as described. Advantageously the performance of emitted or detected light is improved by the controlled, known level of deformation in the layered structure. Thus the output power is increased. Advantageously the emitted wavelength can also be controlled by the deformation control layer because strain changes the bandgap. Furthermore the yield and reliability of devices is enhanced.

The present invention also provides a method of fabricating a layered structure comprising steps to: grow a pseudomorphic deformation control layer on a substrate, the deformation control layer having a third deformation and the substrate having a first deformation; grow one or more device layers on the deformation control layer to form a device, the layers having an aggregate second deformation; wherein the deformation control layer is selected such that the sum of the first, second and third deformations matches a target level of deformation.

Advantageously the method results in a layered structure with a controlled, known deformation. Advantageously the deformation can be compressive, tensile or zero. Advantageously the substrate may be thinner than in prior art layered structures because it only needs to support the other layers and not to counteract or compensate the deformation induced in those layers.

The present invention also provides a method of fabricating a layered structure comprising steps to: grow one or more device layers on a substrate, the substrate having a first deformation and the layers having an aggregate second deformation; grow a pseudomorphic deformation control layer on the device layers, the deformation control layer having a third deformation; wherein the deformation control layer is selected such that the sum of the first, second and third deformations matches a target level of deformation.

Advantageously the method results in a layered structure with a controlled, known deformation. Advantageously the deformation can be compressive, tensile or zero. Advantageously the substrate may be thinner than in prior art layered structures because it only needs to support the other layers and not to counteract or compensate the deformation induced in those layers.

There may be a further step to grow one or more further device layers on the deformation control layer to form a device. Advantageously the deformation control layer may be anywhere within the layered structure and realize the advantages.

One or more of the device layers may be deposited, epitaxially or otherwise, bonded or sputtered in a second process, reactor, tool or machine. For example, one party could fabricate the deformation control layer and, optionally, one or more additional device layers on the substrate and then a second party could deposit, bond, sputter, or otherwise apply one or more additional layers in a different process and/or different machine.

The deformation control layers and/or the device layers may be epitaxially grown. Advantageously the deformation control layer can be introduced into the method without requiring a partially formed layered structure to be moved out of the epitaxy tool. Advantageously mechanisms to introduce defects are minimized.

BRIEF DESCRIPTION OF THE DRAWINGS/FIGURES

The present invention will be more fully described by way of example with reference to the accompanying drawings, in which.

DETAILED DESCRIPTION

Epitaxy or epitaxial means crystalline growth of material, usually via high temperature deposition. Epitaxy can be effected in a molecular beam epitaxy (MBE) tool in which layers are grown on a heated substrate in an ultra-high vacuum environment. Elemental sources are heated in a furnace and directed towards the substrate without carrier gases. The elemental constituents react at the substrate surface to create a deposited layer. Each layer is allowed to reach its lowest energy state before the next layer is grown so that bonds are formed between the layers. Epitaxy can also be performed in a metal-organic vapor phase epitaxy (MOVPE) tool, also known as a metal-organic chemical vapor deposition (MOCVD) tool. Compound metal-organic and hydride sources are flowed over a heated surface using a carrier gas, typically hydrogen. Epitaxial deposition occurs at much higher pressure than in an MBE tool. The compound constituents are cracked in the gas phase and then reacted at the surface to grow layers of desired composition.

Deposition means the depositing of a layer on another layer or substrate. It encompasses epitaxy, chemical vapor deposition (CVD), evaporation, powder bed deposition and other known techniques to deposit material in a layer.

A compound material comprising one or more materials from group III of the periodic table with one or more materials from group V is known as a III-V material. The compounds have a 1:1 combination of group III and group V regardless of the number of elements from each group. Subscripts in chemical symbols of compounds refer to the proportion of that element within that group. Thus $Al_{0.25}GaAs$ means the group III part comprises 25% Al, and thus 75% Ga, whilst the group V part comprises 100% As.

Crystalline means a material or layer with a single crystal orientation. In epitaxial growth or deposition subsequent layers with the same or similar lattice constant follow the registry of the previous crystalline layer and therefore grow with the same crystal orientation. In-plane is used herein to mean parallel to the surface of the substrate; out-of-plane is used to mean perpendicular to the surface of the substrate.

Throughout this disclosure, as will be understood by the skilled reader, crystal orientation<100> means the face of a cubic crystal structure and encompasses [100], [010] and [001] orientations using the Miller indices. Similarly <0001> encompasses [0001] and [000-1] except if the material polarity is critical. Integer multiples of any one or more of the indices are equivalent to the unitary version of the index. For example, (222) is equivalent to, the same as, (111).

Substrate means a planar wafer on which subsequent layers may be deposited or grown. A substrate may be formed of a single element or a compound material, and may be doped or undoped. For example, common substrates include silicon (Si), gallium arsenide (GaAs), silicon germanium (SiGe), silicon germanium tin (SiGeSn), indium phosphide (InP), gallium phosphide (GaP) and gallium antimonide (GaSb).

A substrate may be on-axis, that is where the growth surface aligns with a crystal plane. For example it has <100> crystal orientation. References herein to a substrate in a given orientation also encompass a substrate which is miscut by up to 20° towards another crystallographic direction, for example a (100) substrate miscut towards a (111) plane.

Vertical or out of plane means in the growth direction; lateral or in-plane means parallel to the substrate surface and perpendicular to the growth direction.

Doping means that a layer or material contains a small impurity concentration of another element (dopant) which donates (donor) or extracts (acceptor) charge carriers from the parent material and therefore alters the conductivity. Charge carriers may be electrons or holes. A doped material with extra electrons is called n-type whilst a doped material with extra holes (fewer electrons) is called p-type.

Lattice matched means that two crystalline layers have the same, or similar, lattice spacing and so the second layer will tend to grow isomorphically on the first layer. Lattice constant is the unstrained lattice spacing of the crystalline unit cell. Lattice coincident means that a crystalline layer has a lattice constant which is, or is close to, an integer multiple of the previous layer so that the atoms can be in registry with the previous layer. Lattice mismatch is where the lattice constants of two adjacent layers are neither lattice matched nor lattice coincident. Such mismatch introduces elastic strain into the structure, particularly the second layer, as the second layer adopts the in-plane lattice spacing of the first layer. The strain is compressive where the second layer has a larger lattice constant and tensile where the second layer has a smaller lattice constant.

Where the strain is too great the structure relaxes to minimize energy through defect generation, typically dislocations, known as slip, or additional interstitial bonds, each of which allows the layer to revert towards its lattice constant. The strain may be too great due to a large lattice mismatch or due to an accumulation of small mismatches over many layers. A relaxed layer is known as metamorphic, incoherent, incommensurate or relaxed, which terms are also commonly interchangeable.

A pseudomorphic system is one in which a single-crystal thin layer overlies a single-crystal substrate and where the layer and substrate have similar crystal structures and nearly identical lattice constants. In a pseudomorphic structure the in-plane lattice spacing of the thin layer adopts the in-plane lattice constant of the substrate and is therefore elastically strained, either compressively where the layer has a larger lattice spacing than the substrate or tensilely where the layer has a smaller lattice spacing than the substrate. A pseudomorphic structure is not constrained in the out-of-plane direction and so the lattice spacing of the thin layer in this direction may change to accommodate the strain generated by the mismatch between lattice spacing. The thin layer may alternatively be described as "coherent", "commensurate", "strained" or "unrelaxed", which terms are often used interchangeably. In a pseudomorphic structure all the layers adopt the lattice spacing of the substrate in their respective in-plane lattice spacing.

A layer may be monolithic, that is comprising bulk material throughout. Alternatively it may be porous for some or all of its thickness. A porous layer includes air or vacuum pores, with the porosity defined as the proportion of the area which is occupied by the pores rather than the bulk material. The porosity can vary through the thickness of the layer. For example, the layer may be porous in one or more sublayer. The layer may include an upper portion which is porous with a lower portion that is non-porous. Alternatively the layer may include one or more discrete, non-continuous portions (domains) that are porous with the remainder being non-porous (with bulk material properties). The portions may be non-continuous within the plane of a sublayer and/or through the thickness of the layer (horizontally and/or vertically in the sense of the growth direction). The portions may be distributed in a regular array or irregular pattern across the layer, and/or through it. The porosity may be constant or variable within the porous regions. Where the porosity is variable it may be linearly varied through the thickness, or may be varied according to a different function such as quadratic, logarithmic or a step function.

A fully depleted porous layer means a layer in which there are no charge carriers.

In this description "top" means the upper surface of a layer or the layered structure and generally refers to the surface which has suitable surface finish for further deposition, for example of intermediate or device layers. "Bottom" means the lower surface of a layer or the layered structure and refers to the surface which abuts a previous layer or the substrate, or the back side of the substrate. In general epitaxial deposition occurs with the substrate placed into a suitable machine and layers added in sequence to the top surface of the substrate. Thus the top of the substrate is adjacent to the bottom of the first layer; the top of the first layer is adjacent to the bottom of the second layer; and so on.

In this description "layer" means a planar section of a layered structure which has a top surface and a bottom surface, and is of uniform thickness in the growth direction. Its lateral extent will generally match that of layers above and below it. A layer may also comprise discrete sections with gaps between the sections, formed using a mask or by subsequent selective etching, which nonetheless occupies a defined part of the vertical extent of the layered structure and is deposited in a single operation. A layer may have uniform material properties throughout or may have graded or stepped material properties which change through the thickness of the layer, that is in the growth direction from bottom to top.

The invention will now be described more particularly with reference to FIG. 1 which shows a layered structure 10 according to the present invention. The layered structure 10 comprises a substrate 12. As will become apparent, the substrate 12 may be relatively thin as its purpose is to support the subsequent layers and not to counteract, compensate or correct wafer bow or warp as required of prior art wafers. The substrate 12 has a first deformation which may be the result of processing to form the wafer. It may also be the result of different coefficients of thermal expansion between the substrate 12 and subsequent layers resulting in differential thermal movement when it is heated to a suitable temperature for deposition of the layers of the layered structure 10. For example the substrate 12 may experience different strain at growth and room temperatures and it may cool at a different rate and/or by different amounts compared to subsequent layers.

The layered structure 10 further comprises a device layer 14. The device layer 14 may comprise a plurality of sublayers. The device layer 14 may form a photodetector, photoemitter or combined photodetector and photoemitter. For example the device layer 14 may form a micro-light emitting diode (μ-LED), light emitting diode (LED), resonant cavity light emitting diode (RD-LED), vertical cavity surface emitting laser (VCSEL), edge emitting laser (EEL), distributed feedback laser (DFB) or other light emitting device. Alternatively the device layer 14 may form a PIN diode, photovoltaic detector, avalanche photodetector (APD), single photon avalanche photodetector (SPAD), or another light detector.

The device layer 14 has a second deformation which is the summation of the deformation in each of its sublayers. The second deformation is caused by the lattice mismatch between the device layer 14 and the substrate 12, and may also be caused by lattice mismatch between its sublayers. The lattice parameter is the length of a unit cell which is set by the spacing between atoms. The lattice parameter in unstrained state is known as the lattice constant. The strain in the device layer 14 is the difference in lattice parameters divided by the lattice parameter of the substrate 12, and manifests as deformation of the device layer 14.

Figure 1:
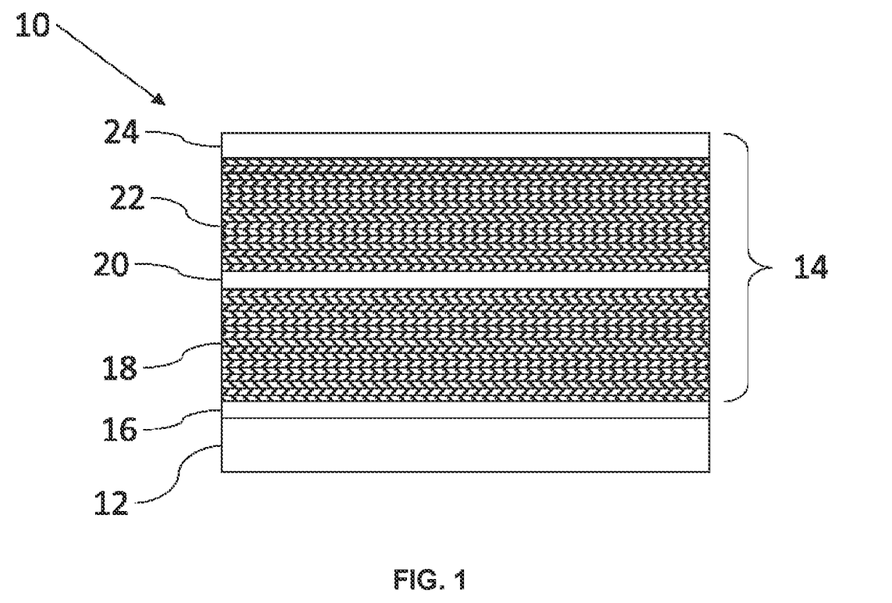
FIG. 1 is a schematic cross-section of a layered structure according to the present invention.

FIG. 1 illustrates sublayers of the device layer 14 of an exemplary VCSEL. Over the substrate 12 is grown a lower mirror 18 which comprises alternating layers of two materials making mirror pairs. Thus the lower mirror 18 is a distributed Bragg reflector (DBR). For example, the mirror pairs may comprise GaAs (lattice constant 5.6533 Å at 300K) and AlAs (lattice constant 5.6611 Å at 300K) so there is a small mismatch between each layer pair. The lower mirror 18 may be doped, for example with n-type dopants, in order to conduct current.

An active layer 20 is grown over the lower mirror 18. The active layer 20 may be bulk material, such as a dilute nitride material including up to 5% nitrogen atom concentration. Alternatively the active layer 20 may comprise quantum wells or quantum dots. The active layer 20 generates and emits photons by the recombination of electrons and holes which are injected into the VCSEL. The material and format, i.e. bulk, quantum wells or quantum dots, may be chosen to yield the desired output wavelength, power or high temperature performance.

The active layer 20 further includes an oxidation sublayer which is oxidized to provide an aperture to channel the charge carriers and for the emission of light. The oxidation sublayer may have a high aluminum content so that it is oxidized at a faster rate than other layers.

An upper mirror 22 is grown over the active layer 20. The upper mirror 22 also comprises alternating layers of material in mirror pairs. The mirror pairs may comprise GaAs and AlAs like the lower mirror 18. An exemplary VCSEL may have up to 30 lower mirror pairs and up to 20 upper mirror pairs so the aggregate lattice mismatch, and thus deformation, is considerable. The substrate 12 may be germanium (Ge) which has lattice constant 5.658 Å. Where the first device layer 14 is GaAs or AlAs there is therefore a small mismatch between the lattice constants which manifests as deformation of the higher device layers 14. The upper mirror 22 may be doped, for example with p-type dopants so that it is oppositely doped to the lower mirror 18, in order to conduct current.

There may be a capping layer 24 over the upper mirror 22. The capping layer 24 may be transparent to the emitted light so as not to obstruct its emission.

There may also be contacts (not shown) provided to inject current on either side of the active layer 20. There may be a bottom contact which is connected to the substrate 12, on either its back side or its front side. Alternatively the bottom contact may be an intracavity contact which is a layer positioned in the layered structure 10 between the substrate 12 and the active layer 20. If the bottom contact is above the lower mirror 18 then the lower mirror 18 need not be doped. There may be a top contact which is connected to the top of the layered structure 10, for example to the top of the capping layer 24. In this case the top contact includes an aperture which is at least as large as the aperture in the oxidized oxidation sublayer so that it does not obstruct the emission of light from the active layer 20. Alternatively the top contact may be an intracavity contact which is positioned in the layered structure 10 above the active layer 20. If the top contact is between the active layer 20 and the upper mirror 22 then the upper mirror 22 need not be doped.

The layered structure 10 further comprises a pseudomorphic deformation control layer 16. The deformation control layer 16 comprises a different material to the substrate 12 and therefore usually has a different lattice constant. The deformation control layer 16 has a third deformation. It is pseudomorphic with respect to the substrate 12 which means that strain or deformation which arises as a result of lattice parameter mismatch is not relaxed by dislocations or additional interstitial bonds. Thus the deformation control layer 16 has the same in plane lattice parameter as the substrate 12 but accommodates the lattice mismatch by deformation in the out of plane direction, where in plane means parallel to the plane of the substrate 12.

The thickness and material of the deformation control layer 16 is selected in order to control the deformation of the layered structure 10. In particular, the deformation of the deformation control layer 16 is selected so that the sum of the first, second and third deformations matches a target level of deformation. The deformation control layer 16 may comprise InGaP, AlInP, InGaAs, GaAsSb, GaAs, AlGaAs, AlGaAsSb, InGaAsSb, GaAsP, AlGaAsP or another binary, ternary, quaternary or quintenary III-V alloy. The deformation control layer 16 can be selected to have a lattice parameter which is larger than that of the substrate 12 (see FIG. 2) in order to produce net compressive deformation in the layered structure 10. Alternatively the deformation control layer 16 can be selected to have a lattice parameter which is smaller than that of the substrate 12 in order to produce net tensile deformation. Net compressive deformation causes a convex bowing whereas tensile deformation causes a concave bowing.

Figure 2:
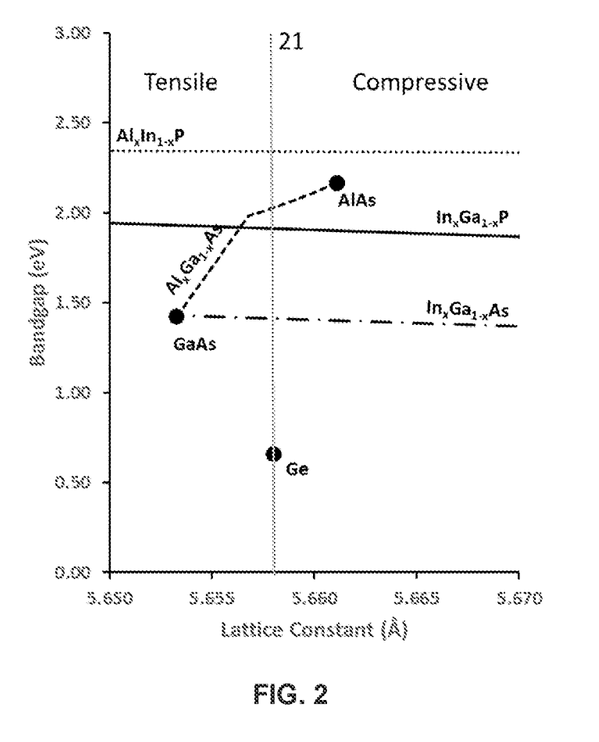
FIG. 2 is a graph of lattice constant against bandgap for various materials.

FIG. 2 is a graph plotting the lattice constant of various group IV and III-V binary materials against their bandgap. The lines between pairs of materials illustrate how the lattice constant-bandgap relationship changes as the composition is graded from one material to the other. Line 21 is a vertical line through the lattice constant of Ge, 5.658 Å, which is a preferred material for substrate 12. Materials and compositions to the left of the line 21 have a smaller lattice constant than Ge whereas those to the right of the line 21 have a larger lattice constant than Ge. Thus materials and compositions to the left of line 21 are suitable for a deformation control layer 16 which exhibits tensile deformation while materials and compositions to the right of line 21 are suitable for a deformation control layer 16 which exhibits compressive deformation. It will be apparent from inspection of the graph in FIG. 2 that some ternary alloys, such as AlGaAs and InGaP can be either compressive or tensile relative to Ge depending on the relative proportions of their constituent alloys (particularly the amount of Ga and proportions of In/Ga respectively).

The deformation control layer 16 may be selected to counteract, compensate or correct the first deformation which is present in the substrate 12 before processing, for example deformation caused by bow or warp of the wafer. Advantageously this could result in fewer substrate wafers being rejected for being outside of tolerable limits of bow and/or warp. Additionally or alternatively the deformation control layer 16 can be selected in order to achieve a desirable level of overall deformation in the layered structure 10, that is to introduce convex or concave bow. For example, a processing line which is set up for conventional layered structures grown on GaAs substrates may be arranged to accommodate a level of deformation which is greater than that naturally present if a Ge substrate is used. The deformation can be artificially reintroduced by selection of a suitable material and/or thickness of deformation control layer 16 so that the process line need not be redesigned.

The thickness of the deformation control layer 16 can also be non-constant across a layer or the material composition may be varied across a layer. In this way the effect that bowing has on the growth process can be compensated. For example, a bowed substrate 12 will result in subsequent layers which are non-uniform in thickness and/or composition and characteristics because they are deposited in a uniform manner across a non-uniform surface. For example, the level of doping in a layer may change at different positions dependent on the amount of bow or warp in the layer(s) beneath it.

Figure 3:
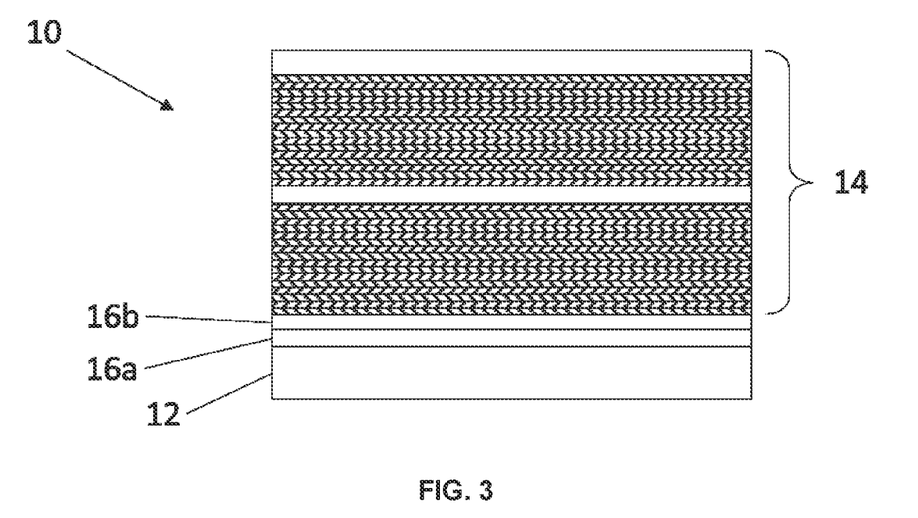
FIG. 3 is a schematic cross-section of a layered structure according to the present invention.
Figure 4:
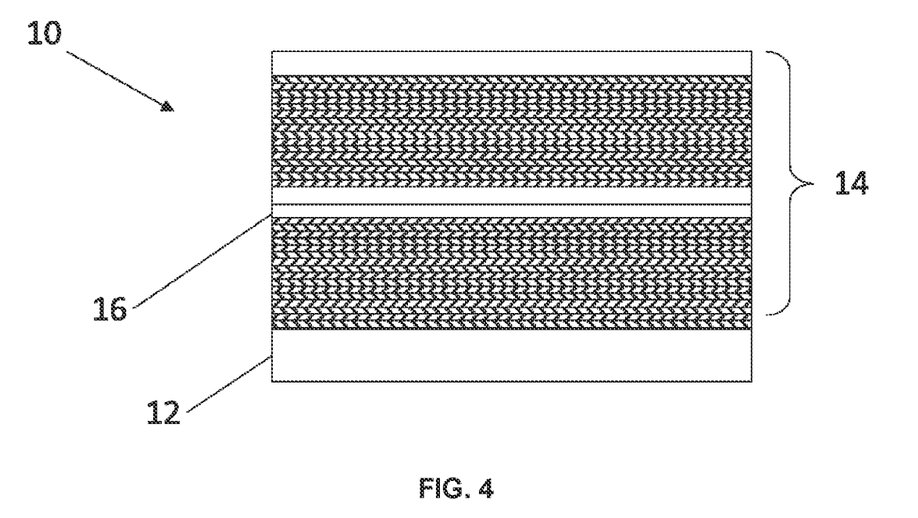
FIG. 4 is a schematic cross-section of a layered structure according to the present invention.

The deformation control layer 16 may be a single layer. The deformation control layer 16 may have a graded composition such that its composition and properties change between a surface adjacent to the substrate 12 and a surface adjacent to the device layer 14. This may be particularly efficacious at interfaces which are in the current path because strain related defects are known to nucleate and propagate from areas of high strain such as abrupt interfaces between layers with different lattice parameters. Alternatively the deformation control layer 16 may comprise two or more discrete layers that are adjacent to each other such that there is an abrupt change in material properties between the first and second portions 16a, 16b of the deformation control layer 16 as illustrated in FIG. 3. Alternatively it may be implemented as two or more discrete layers 16a, 16b with one or more of the deformation control layers 16 being positioned within the device layer 14. For example a deformation control layer 16 may be positioned between mirror pairs or between the mirror pairs and active layer of a VCSEL as illustrated in FIG. 4.

The layered structure 10 may be grown epitaxially by molecular beam epitaxy (MBE) or metal-organic vapor phase epitaxy (MOVPE, also known as metal-organic chemical vapor deposition, MOCVD). First the substrate 12 is placed into the relevant epitaxy reactor. Then the deformation control layer 16 is deposited as a single layer having uniform properties, two or more discrete layers with different properties, or as a graded layer in which the properties gradually change as the thickness of the layer 16 increases. Finally the device layer 14 is grown over the deformation control layer 16. Advantageously the deformation control layer 16 compensates or corrects any deformation in the substrate 12 so that the device layers 14 are grown on a flat precursor layer, resulting in more uniformity.

In another version of the growth method one or more sublayers of the device layer 14 is deposited on the substrate 12. Then the deformation control layer 16 is deposited, in a single layer with uniform properties, two or more discrete layers or as a graded layer. Finally one or more additional sublayers of the device layer 14 is deposited over the deformation control layer 16. Thus there is an embedded deformation control layer 16. This is illustrated in FIG. 4 in which the layered structure 10 is a VCSEL and the deformation control layer 16 is grown between the lower mirror pairs 18 and the active layer 20. Advantageously the deformation control layer 16 compensates the aggregate strain from the substrate 12 and sublayers of the device layer 14 meaning that the final device layers 14 can be grown on a flat or relatively flat precursor layer with more uniformity.

Figure 5:
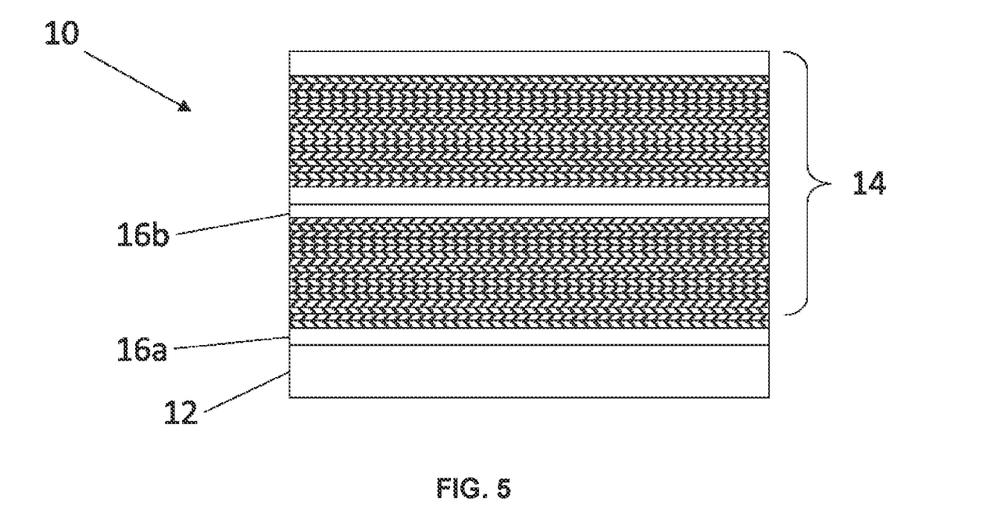
FIG. 5 is a schematic cross-section of a layered structure according to the present invention.

In another version of the growth method a first deformation control layer 16a is deposited on the substrate 12. Then one or more sublayers of the device layer 14 is deposited on the deformation control layer 16. Then a second deformation control layer 16b is deposited before one or more further sublayers of the device layer 14 is deposited. This is illustrated in FIG. 5. In this case there is a first deformation control layer 16*a* adjacent to the substrate 12, which may accommodate or rectify any bow or warp which is beyond tolerance limits, and a second deformation control layer 16*b* embedded in the device layer 14 which can counteract excessive deformation accumulated in the device layer 14. The third deformation is the sum of the deformation exercised by the first and second deformation control layers 16*a*, 16*b*. Advantageously, each deformation control layer 16*a*, 16*b* counteracts, compensates or corrects deformation in the layer or layers below it and/or applies deformation which is counteracted, compensated or corrected in the layer or layers above it.

Figure 6:
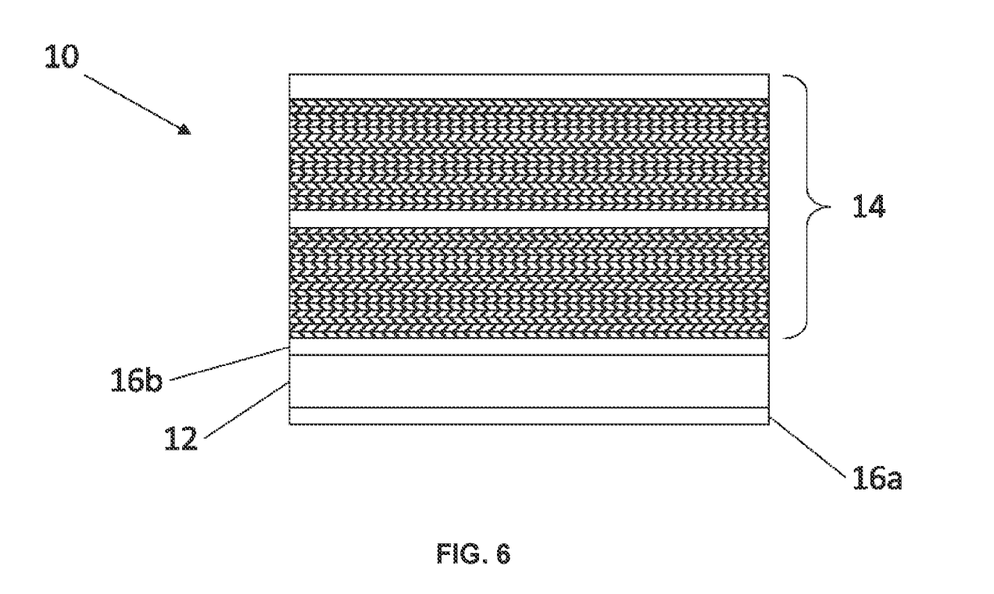
FIG. 6 is a schematic cross-section of a layered structure according to the present invention.

In a further version of the growth method a first deformation control layer 16*a* is grown on one side of the substrate 12 as a backside coating. A backside coating may improve the dielectric contact of the substrate 12 but is typically too thin to have a mechanical effect. By growing a first deformation control layer 16*a* on the substrate 12 which is capable of acting as a backside coating the deformation control layer 16*a* provides both functions in a single layer. For example, the deformation control layer 16*a* may be highly conductive so that it performs the function of contacting as well as the deformation control. The substrate 12 is then turned over and the device layer 14 and optional second deformation control layer 16*b* are grown in any of the configurations discussed above. FIG. 6 illustrates one example of first deformation control layer 16*a* being formed on the underside of substrate 12 so that it acts as a backside coating. In FIG. 6 the second deformation control layer 16*b* is deposited directly over the substrate 12 and the device layer 14 is formed over it. However, in other arrangements the second deformation control layer 16*b* may be embedded in the device layer 14 or there may be a second deformation control layer 16*b* adjacent the substrate 12 and another deformation control layer 16*c* embedded in the device layer 14. In another arrangement there is a first deformation control layer 16*a* on the underside of the substrate 12 which acts as the backside coating but no second deformation control layer 16*b*.

Figure 7:
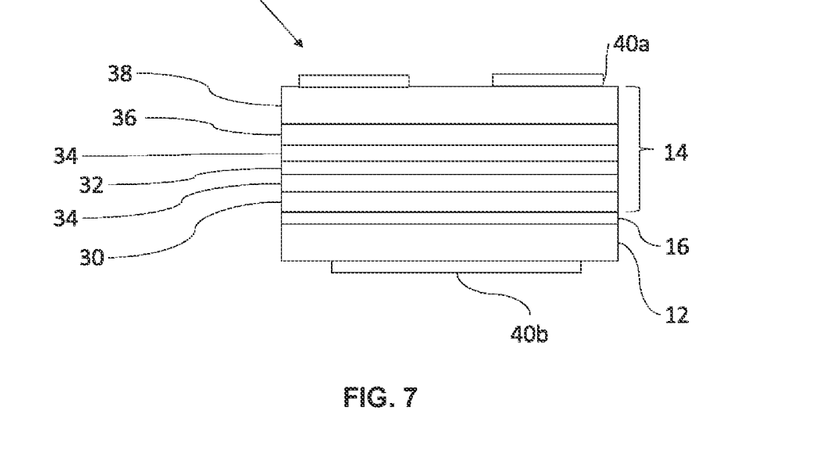
FIG. 7 is a schematic cross-section of a layered structure according to the present invention.

FIG. 7 is an LED which is a layered structure 10 with a substrate 12, deformation control layer 16 and device layer 14. As with the VCSEL described above the deformation control layer 16 may be between the substrate 12 and the device layer 14 formed over it. Alternatively it may be embedded within the device layer 14. Alternatively it may be on the underside of the substrate 12 and may also act as the backside coating. There may be first and second deformation control layers 16*a*, 16*b* which are at different positions in the layered structure 10 as described above.

In the case of an LED as shown in FIG. 7 the device layers 14 are different to those of the VCSEL previously described. Grown on or over the substrate 12 is a buffer layer 30 which improves the surface morphology. The active layer 32 is selected to recombine charge carriers at the desired wavelength. It may comprise bulk material including a dilute nitride material having up to 5% nitrogen (N) atom concentration. Alternatively the active layer 32 may comprise quantum wells or quantum dots.

On either side of the active layer 32 may be cladding layers 34 which confine charge carriers in order to increase the creation of photons in the active layer 32. Thus the cladding layers 34 improve the optical output power. The cladding layers 34 typically have a wider band gap than the active layer 32.

Above the upper cladding layer 34 is a window layer 36 which is transparent at the relevant wavelength in order to allow the photons to be emitted from the active layer 32 in the desired direction. As illustrated the LED is front emitting. However, it may alternatively be back emitting, in which case the window layer 24 is below the active layer 32 and layers below it must also be transparent at the relevant wavelength.

Over the window layer 36 is a coating layer 38 which forms a protective and/or anti-reflection coating for the window layer 36. The coating layer 38 may comprise indium tin oxide (ITO) which is conducting. It therefore forms part of the conduction path from the contact.

Contacts 40*a*, 40*b* are applied to the top of the coating layer 38 and to the substrate 12 in order to inject charge carriers. The bottom contact 40*b* may be applied to the back of the substrate 12 as shown. Alternatively it may be applied to the front of the substrate 12 once a mesa has been formed through the deformation control layer 16 and device layer 14. The top contact 40*a* includes an aperture to allow the light to be emitted from the active layer 32.

Alternatively, one or both contacts 40*a*, 40*b* may be replaced by an intracavity contact layer which is a layer intermediate the device layers 14 which can be contacted from the side instead of its top or bottom surface. One of the contacts 40 must be above the active layer 32 and one below it. Typically intracavity contacts are positioned adjacent to the cladding layers 34, either between the cladding layer 34 and active layer 32 or adjacent the opposite surface of the cladding layer 34 from the active layer 32.

The deformation control layer 16 of the present invention is also applicable to a resonant cavity LED which includes a mirror on one side of the active layer 32, typically between the buffer layer 30 and the lower cladding layer 34, and a reflective top layer such as a sheet of metal or upper mirror.

The deformation control layer 16 of the present invention is also applicable to a micro-LED which has the same construction as an LED but is diced into smaller devices for use. Thus more micro-LED devices are cut from a single wafer than LED devices.

Figure 8:
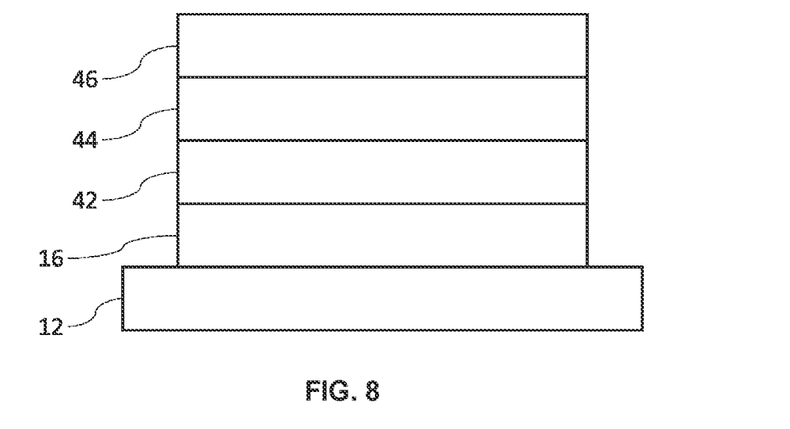
FIG. 8 is a schematic cross-section of a layered structure according to the present invention.

FIG. 8 is a PIN diode, for example a PIN photodetector, having a substrate 12. On or over the substrate 12 is a first layer 42 which is an n-doped semiconductor. The first layer 42 may be a III-V semiconductor or a group IV semiconductor, for example formed of Si. On or over the first layer 42 is an intrinsic layer 44, which is an intrinsic (undoped) III-V semiconductor. On or over the intrinsic layer 44 is a second layer 46 which is a p-doped semiconductor. The second layer 46 may be a III-V semiconductor or a group IV semiconductor, for example formed of Si. Charge carriers are injected or collected in the first and second layers 42, 46 which are used as ohmic contacts. Photons are absorbed in the intrinsic layer 44, which acts as an absorber layer, and converted into carriers through photoabsorption. When the diode is reverse biased the carriers are swept into the first and second layers 42, 46 creating current flow. Alternatively the first layer 42 may be p-doped and the second layer 46 may be n-doped.

The deformation control layer 16 may be provided between any pair of layers in the PIN diode layered structure 10. Thus it may be between the substrate 12 and the first layer 42, as illustrated in FIG. 8; between the first layer 42 and the intrinsic layer 44; or between the intrinsic layer 44 and the second layer 46. The deformation control layer 16 compensates, counters or corrects deformation in the previous layers and/or applies pre-strain to deform the layered structure 10 which is corrected or compensated by subsequent layers.

Figure 9:
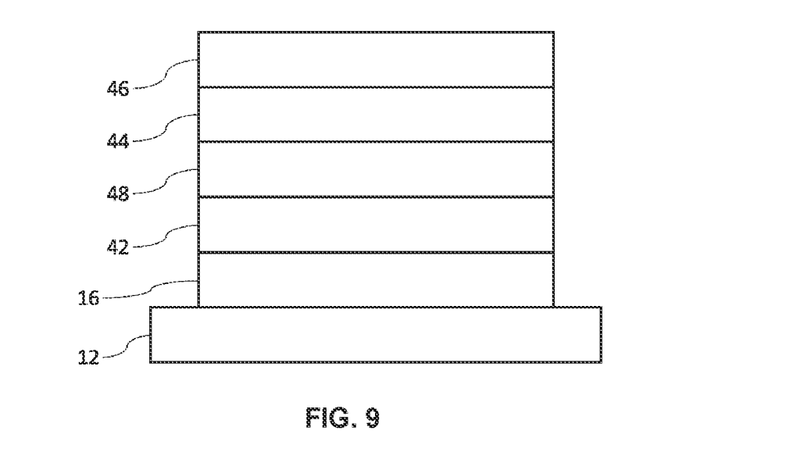
FIG. 9 is a schematic cross-section of a layered structure according to the present invention.

FIG. 9 is an avalanche photodetector (APD). It is similar to the PIN photodetector shown in FIG. 8 in that it has a substrate 12, first layer 42, intrinsic layer 44 and second layer 46. The first and second layers 42, 46 are oppositely doped, one n-type and one p-type. The APD includes a multiplication layer 48 which is a semiconductor. The multiplication layer 48 may be a III-V semiconductor or a group IV semiconductor, for example formed of Si. The multiplication layer 48 is between the intrinsic layer 44 and one of the first and second layer 42, 46, whichever is the layer used for current extraction. It increases the photocurrent by impact ionization.

The deformation control layer 16 may be provided between any pair of layers in the APD layered structure 10. Thus it may be between the substrate 12 and the first layer 42, as illustrated in FIG. 9; between the first layer 42 and the multiplication layer 48; between the multiplication layer 48 and the intrinsic layer 44; or between the intrinsic layer 44 and the second layer 46. The deformation control layer 16 compensates, counters or corrects deformation in the previous layers and/or applies pre-strain to deform the layered structure 10 which is corrected or compensated by subsequent layers.

Although the substrate 12 has been described as Ge it may alternatively comprise an alloy of Ge, for example SiGe or SiGeSn. The first deformation is measured at the top surface of the substrate 12, being the surface on which the device layer 14 is grown. The substrate 12 may comprise two or more discrete sublayers, each of which has distinct properties and with an abrupt change in properties between the sublayers. For example, the substrate 12 may comprise a sublayer of SiGe with a sublayer of Ge grown over it. Alternatively, the substrate 12 may have a graded composition through its thickness in the growth direction. For example, the substrate 12 may comprise SiGe at its bottom surface and have a reducing quantity of Si in the composition through its thickness until the top surface is Ge or is SiGe with minimal inclusion of Si.

Alternatively the substrate 12 may comprise Ge, SiGe, SiGeSn or GaP deposited on Si, which forms a highly compressively strained compound substrate 12. In this circumstance the deformation control layer 16 may comprise SiGe or SiGeSn in addition to the III-V compounds described above.

What is claimed is:

1. A layered structure comprising:
   a substrate having a first deformation, wherein the substrate comprises germanium;
   one or more device layers forming an entire device, the entire device having a second deformation; and
   a deformation control layer which is pseudomorphic with respect to the substrate, the deformation control layer having a third deformation,
   wherein the deformation control layer is selected such that a sum of the first deformation, the second deformation, and the third deformation matches a target level of deformation,
   wherein the target level of deformation comprises a net compressive deformation or a net tensile deformation,
   wherein the deformation control layer is positioned between the substrate and the entire device, and
   wherein the entire device is directly on an upper surface of the deformation control layer.

2. The layered structure of claim 1, wherein:
   the substrate is Ge, SiGe, SiGeSn, Ge on Si, SiGe on Si, or SiGeSn on Si, and
   the first deformation is measured at an upper surface of the substrate upon which the deformation control layer is grown.

3. The layered structure of claim 1, wherein the deformation control layer comprises InGaP, AlInP, InGaAs, GaAsSb, GaAs, AlGaAs, GaAsP, AlGaAsP, AlGaAsSb, or a combination thereof.

4. The layered structure of claim 1, wherein the deformation control layer comprises a single layer.

5. The layered structure of claim 1, wherein the deformation control layer comprises a plurality of deformation control layers.

6. The layered structure of claim 5, wherein the plurality of deformation control layers are grown at discrete positions within the layered structure.

7. The layered structure of claim 1, wherein the deformation control layer comprises a graded composition, the graded composition having a first composition at a lower surface proximal to the substrate and a second composition at the upper surface distal to the substrate.

8. The layered structure of claim 1, wherein the target level of deformation is a range.

9. The layered structure of claim 8, wherein the range of the target level of deformation is based on a process tolerance limit.

10. The layered structure of claim 9, wherein the process tolerance limit comprises a tolerance limit of bow and/or warp.

11. The layered structure of claim 1, wherein a lattice parameter of the deformation control layer is larger than a lattice parameter of the substrate resulting in net compressive deformation.

12. The layered structure of claim 1, wherein a lattice parameter of the deformation control layer is smaller than a lattice parameter of the substrate resulting in net tensile deformation.

13. The layered structure of claim 1, wherein the one or more device layers comprise a plurality of sublayers with opposite-acting deformations which sum to the second deformation.

14. A photoemitter comprising the layered structure of claim 1.

15. A photodetector comprising the layered structure of claim 1.

16. The layered structure of claim 1, wherein a lower surface of the deformation control layer is directly on the substrate.

17. The layered structure of claim 1, wherein the deformation control layer comprises one or more epitaxial layers.

18. A method of fabricating a layered structure, the method comprising:
   growing a pseudomorphic deformation control layer on a substrate, the pseudomorphic deformation control layer having a third deformation and the substrate having a first deformation, wherein the substrate comprises germanium; and
   growing one or more device layers directly on the pseudomorphic deformation control layer to form an entire device, the entire device having an aggregate second deformation,
   wherein the pseudomorphic deformation control layer is selected such that a sum of the first deformation, the aggregate second deformation, and the third deformation matches a target level of deformation, wherein the target level of deformation comprises a net compressive deformation or a net tensile deformation, wherein the pseudomorphic deformation control layer is positioned between the substrate and the entire device, and wherein the entire device is directly on an upper surface of the pseudomorphic deformation control layer.

19. The method of claim 18, wherein a lower surface of the pseudomorphic deformation control layer is directly on the substrate.

20. The method of claim 18, wherein the growing comprises epitaxially growing the pseudomorphic deformation control layer and the entire device consecutively in an epitaxy tool.

* * * * *